(12) United States Patent
Wu et al.

(10) Patent No.: US 10,651,106 B2
(45) Date of Patent: May 12, 2020

(54) ELECTRICAL CONNECTOR EQUIPPED WITH CLIP

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Heng-Kang Wu, Shenzhen (CN); Fu-Jin Peng, Shenzhen (CN)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/247,593

(22) Filed: Jan. 15, 2019

(65) Prior Publication Data

US 2019/0221491 A1  Jul. 18, 2019

(30) Foreign Application Priority Data

Jan. 15, 2018  (CN) .................... 2018 2 0063803 U

(51) Int. Cl.
*H01L 23/32* (2006.01)
*H01R 12/70* (2011.01)
(Continued)

(52) U.S. Cl.
CPC ......... *H01L 23/32* (2013.01); *H01R 12/7058* (2013.01); *H01R 12/7076* (2013.01);
(Continued)

(58) Field of Classification Search
CPC ........... H01R 12/7058; H01R 12/7076; H01R 13/22; H01R 13/635; H05K 2201/10393;
(Continued)

(56) References Cited

U.S. PATENT DOCUMENTS 7,001,197 B2   2/2006  Tyco
9,385,457 B2   7/2016  Intel
(Continued)

FOREIGN PATENT DOCUMENTS

CN   202503137 U   10/2012
CN   205104653 U    3/2016
(Continued)

*Primary Examiner* — Oscar C Jimenez
(74) *Attorney, Agent, or Firm* — Wei Te Chung; Ming Chieh Chang

(57) ABSTRACT

An electrical connector includes an insulative housing retaining a plurality of contacts therein and surrounded by a metallic seat. A clip includes a frame with corresponding four walls to commonly form a receiving cavity to receive the electronic package therein, and each wall forms a pressing section to downwardly press an upward surface of the electronic package. A pair of latches are formed on a lower side of the frame to cooperate with the pressing sections of the walls to retain electronic package within the receiving cavity to be wholly a sub-assembly for being commonly received within the electrical connector. The clip includes a releasing handle to actuate the corresponding latch, and the releasing handle is positioned in an opening of the seat and intimately above the printed circuit board to function as a foolproof mechanism for loading the electronic package in a right orientation.

16 Claims, 12 Drawing Sheets

(51) Int. Cl.
*H01R 13/635* (2006.01)
*H01R 13/22* (2006.01)
*H05K 7/14* (2006.01)

(52) U.S. Cl.
CPC ........... *H01R 13/22* (2013.01); *H01R 13/635* (2013.01); *H05K 7/1402* (2013.01); *H05K 2201/10393* (2013.01); *H05K 2201/10424* (2013.01)

(58) Field of Classification Search
CPC ........... H05K 2201/10424; H05K 7/10; H05K 7/1053; H05K 7/1061; H01L 23/32
See application file for complete search history.

(56) References Cited

U.S. PATENT DOCUMENTS

| | | | | |
|---|---|---|---|---|
| 2006/0022335 A1* | 2/2006 | Kao | ................ | H01L 23/32 257/727 |
| 2010/0167572 A1* | 7/2010 | Terhune, IV | ........ | H01R 13/193 439/331 |
| 2013/0149886 A1* | 6/2013 | Terhune, IV | ........ | H05K 7/1053 439/350 |
| 2014/0162475 A1* | 6/2014 | Chawla | ................ | H01R 12/724 439/76.1 |
| 2016/0149322 A1* | 5/2016 | Peng | .................. | H01R 12/7076 439/626 |
| 2016/0352029 A1* | 12/2016 | Tu | ........................... | H01R 12/88 |
| 2016/0372861 A1* | 12/2016 | Ju | ....................... | H01R 12/7076 |
| 2016/0372869 A1* | 12/2016 | Ju | ........................... | H01R 13/64 |
| 2017/0359905 A1* | 12/2017 | Hsu | ........................ | H01R 12/00 |
| 2018/0183176 A1* | 6/2018 | Liao | .................... | H01R 13/5213 |
| 2018/0190561 A1* | 7/2018 | Wu | ........................ | H01L 23/32 |

FOREIGN PATENT DOCUMENTS

| | | |
|---|---|---|
| CN | CN103855506 B | 8/2017 |
| CN | CN206401563 U | 8/2017 |

* cited by examiner

ELECTRICAL CONNECTOR EQUIPPED WITH CLIP

BACKGROUND OF THE INVENTION

1. Field of the Invention

The present invention relates generally to an electrical connector, and more particularly to the electrical connector equipped with the clip for loading into the corresponding connector.

2. Description of Related Arts

U.S. Patent Publication Application No. 20180190561 discloses a clip for holding/loading an electronic package within an electrical connector. Anyhow, because the releasing/pressing handle is not aligned with the latch but in an offset manner along a transverse direction, the unlatching effect is not efficient but through a torsional operation. By the way, in some situations, it is desired to have the electronic package constantly equipped with the clip and commonly uploaded into the corresponding connector rather than the electronic package alone.

An improved clip for use with the electronic package is desired.

SUMMARY OF THE INVENTION

An object of the present invention is to provide a clip retaining an electronic package thereto for being commonly loaded into an electrical connector which is mounted upon a printed circuit board so as to totally form an electrical connector assembly. The electrical connector includes an insulative housing retaining a plurality of contacts therein and surrounded by a metallic seat. The clip includes a frame with corresponding four walls to commonly form a receiving cavity to receive the electronic package therein, and each wall forms a pressing section to downwardly press an upward surface of the electronic package. A pair of latches are formed on a lower side of the frame to cooperate with the pressing sections of the walls to retain electronic package within the receiving cavity to be a sub-assembly for being commonly received within the electrical connector. The clip includes a releasing handle to actuate the corresponding latch, and the releasing handle is positioned in an opening of the seat and intimately above the printed circuit board to function as a foolproof mechanism for loading the electronic package in a right orientation.

The housing is equipped with a detachable key for engagement with a notch of the electronic package, and a portion of the corresponding wall of the clip is removed to avoid interference with the key.

DETAILED DESCRIPTION OF THE PREFERRED EMBODIMENT

Figure 1:
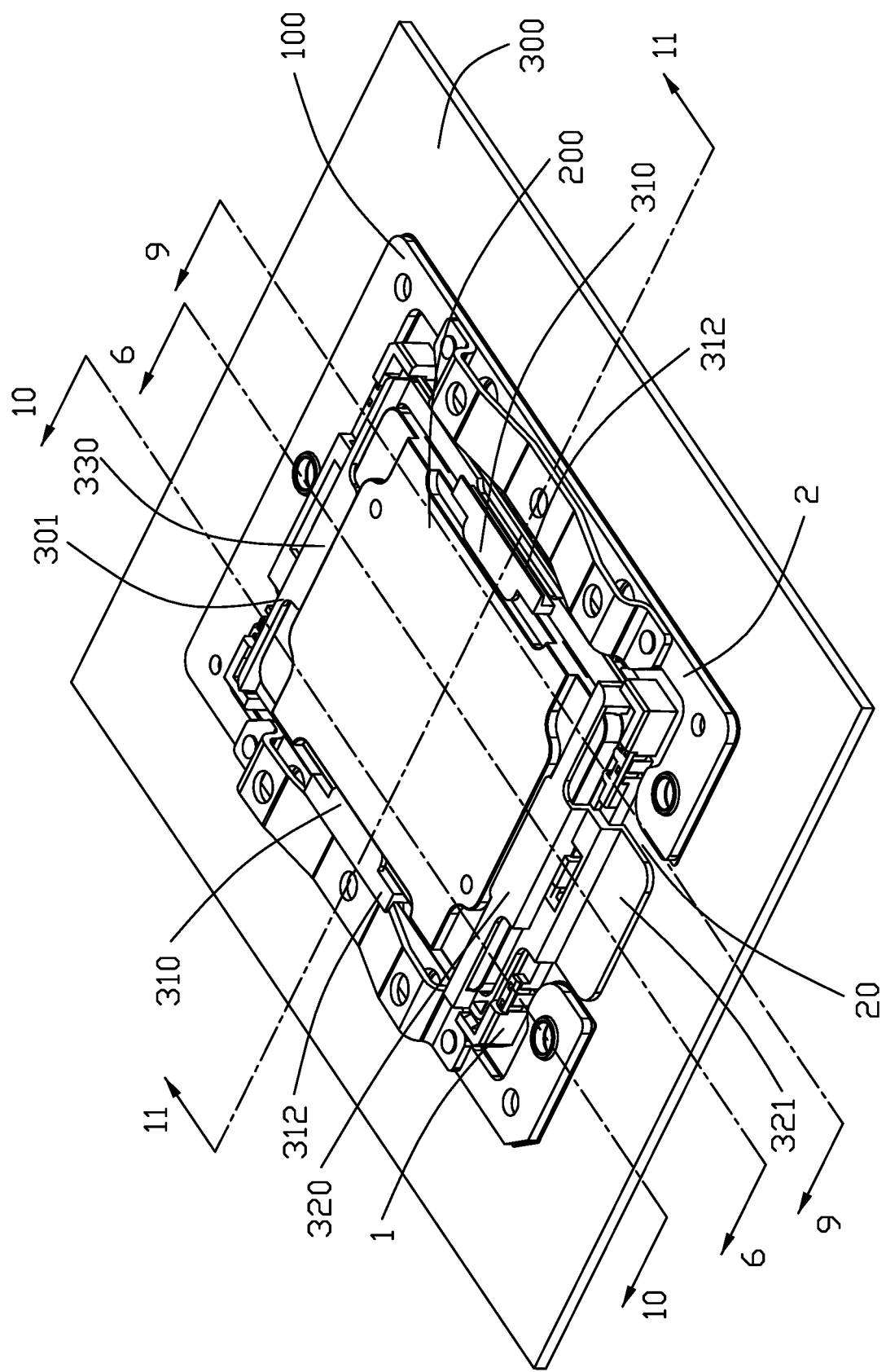
FIG. 1 is a perspective view of an electrical connector assembly according to the present invention.
Figure 2:
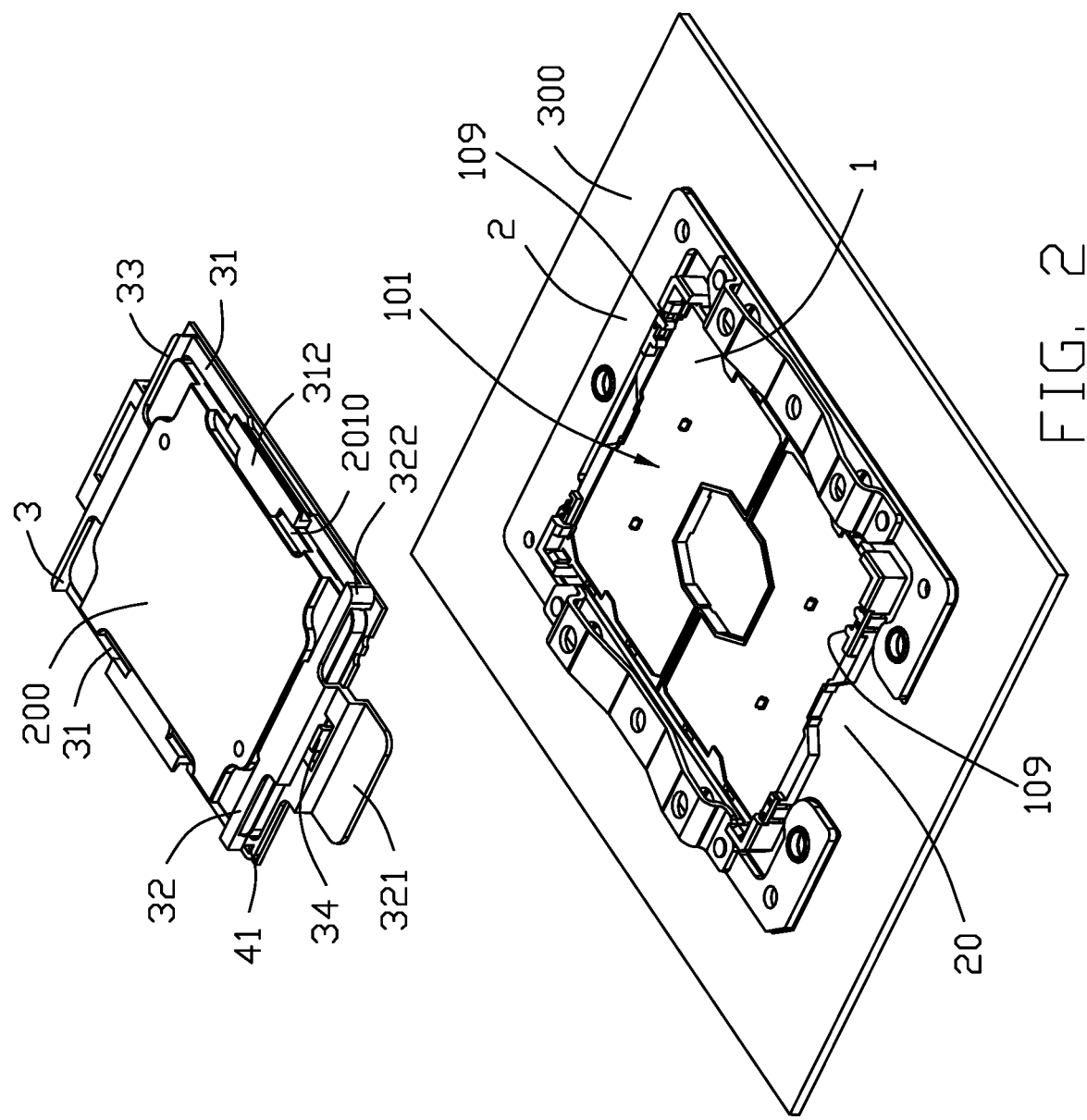
FIG. 2 is an exploded perspective view of the electrical connector assembly of FIG. 1 wherein the electronic package associated with the clip is removed away from the electrical connector.
Figure 2A:
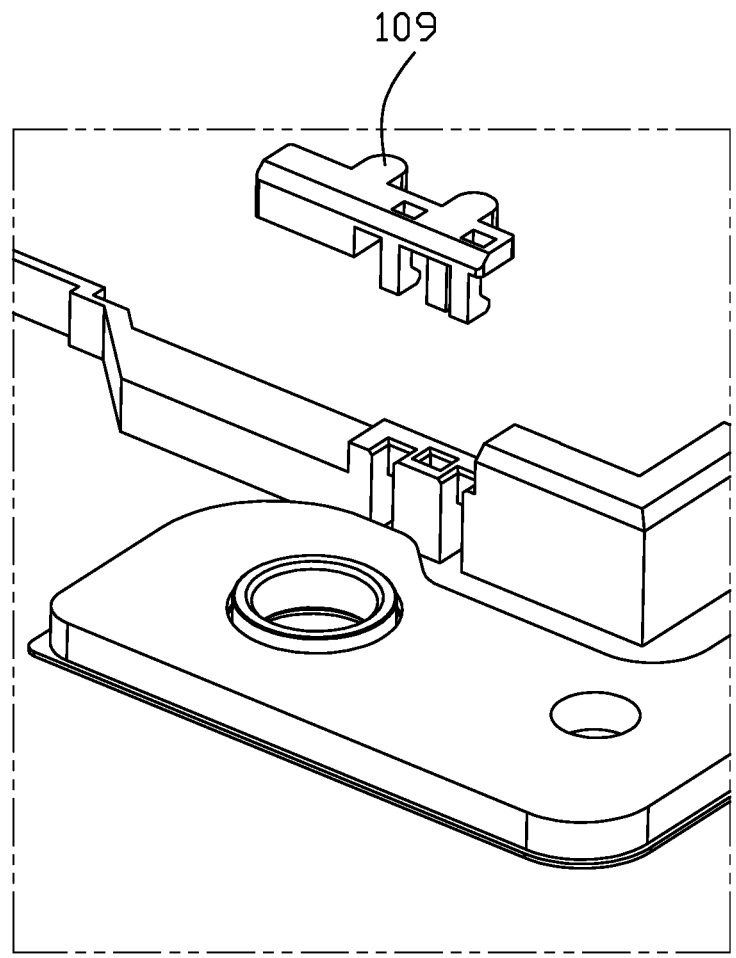
FIG. 2(A) is an enlarged perspective view of a portion of the electrical connector assembly of FIG. 1 to show the attachable key is detached from the housing.
Figure 3:
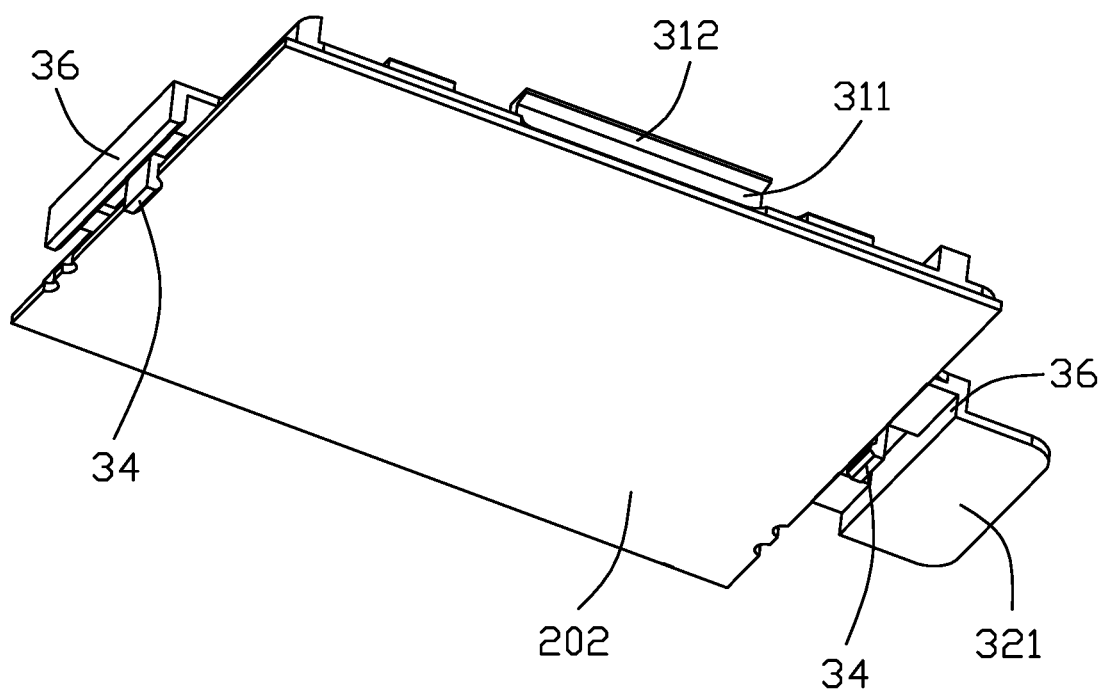
FIG. 3 is a perspective view of a sub-assembly including the clip and the associated electronic package of the electrical connector assembly of FIG. 1.
Figure 4:
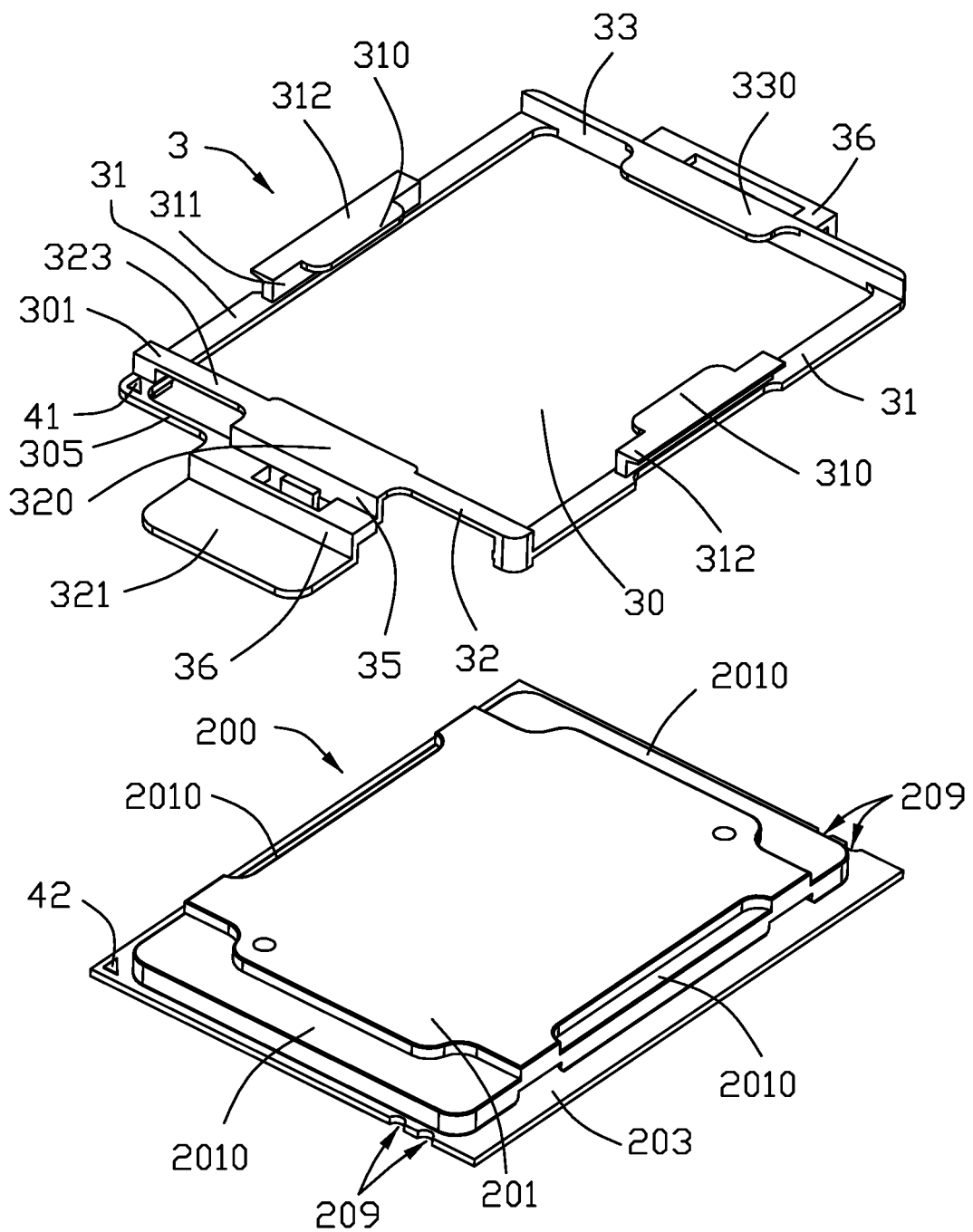
FIG. 4 is an exploded perspective view of the sub-assembly of the electrical connector assembly of FIG. 1 wherein the electronic package is removed away from the clip.
Figure 5:
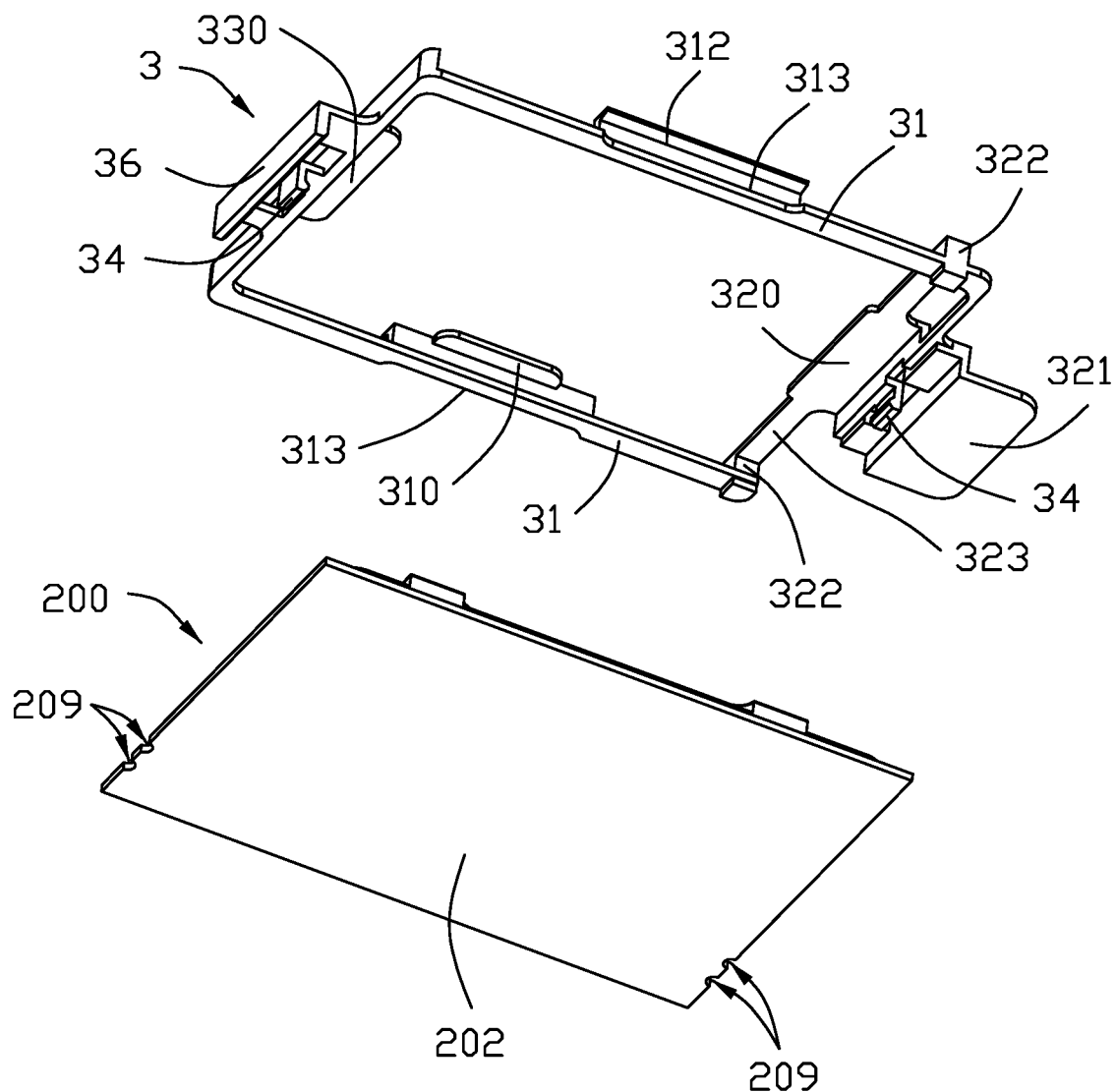
FIG. 5 is another exploded perspective view of the sub-assembly of the electrical connector assembly of FIG. 1 along line 5-5.
Figure 6:
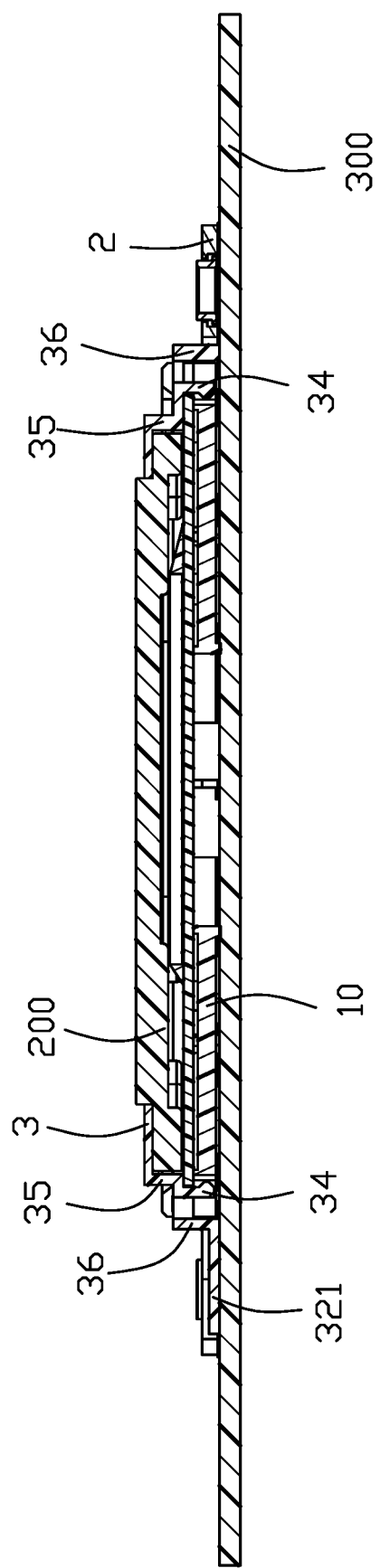
FIG. 6 is a cross-sectional view of the electrical connector assembly of FIG. 1.
Figure 7:
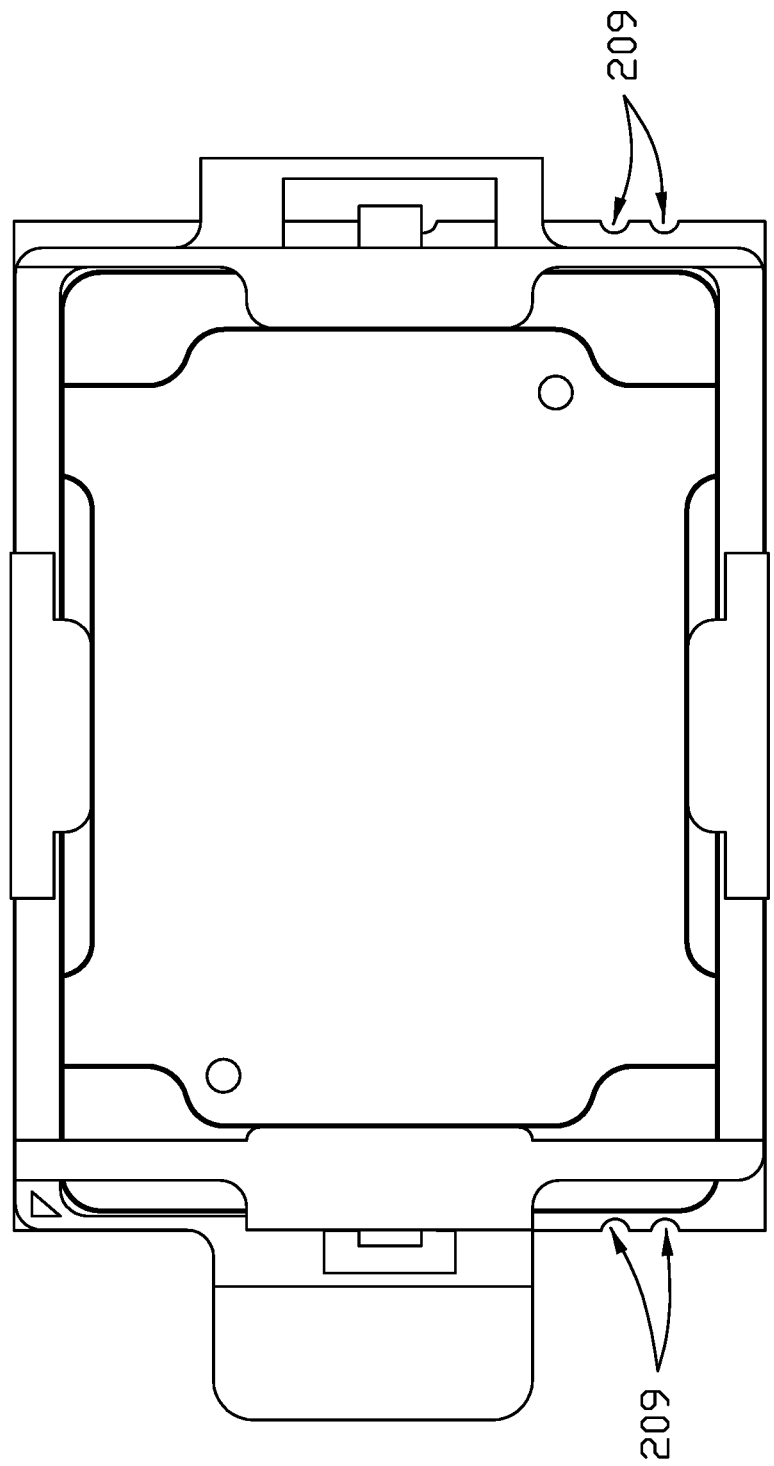
FIG. 7 is a top view of the sub-assembly of the electrical connector assembly of FIG. 3.
Figure 8:
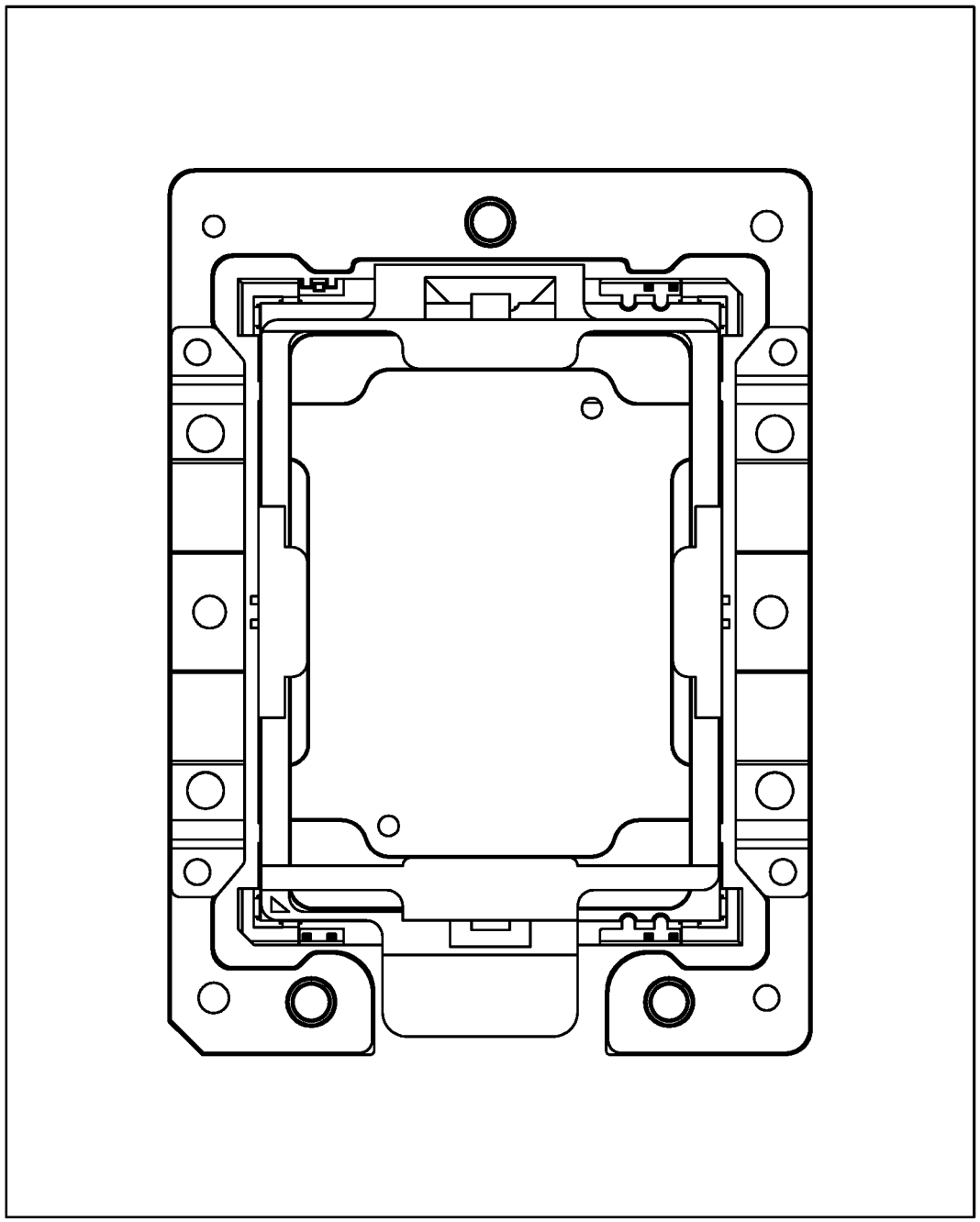
FIG. 8 a top view of the electrical connector assembly of FIG. 1.
Figure 9:
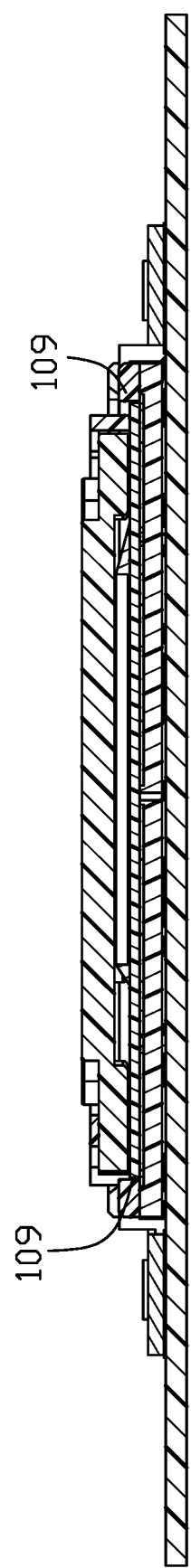
FIG. 9 is a cross-sectional view of the electrical connector assembly of FIG. 1 of line 9-9.
Figure 10:
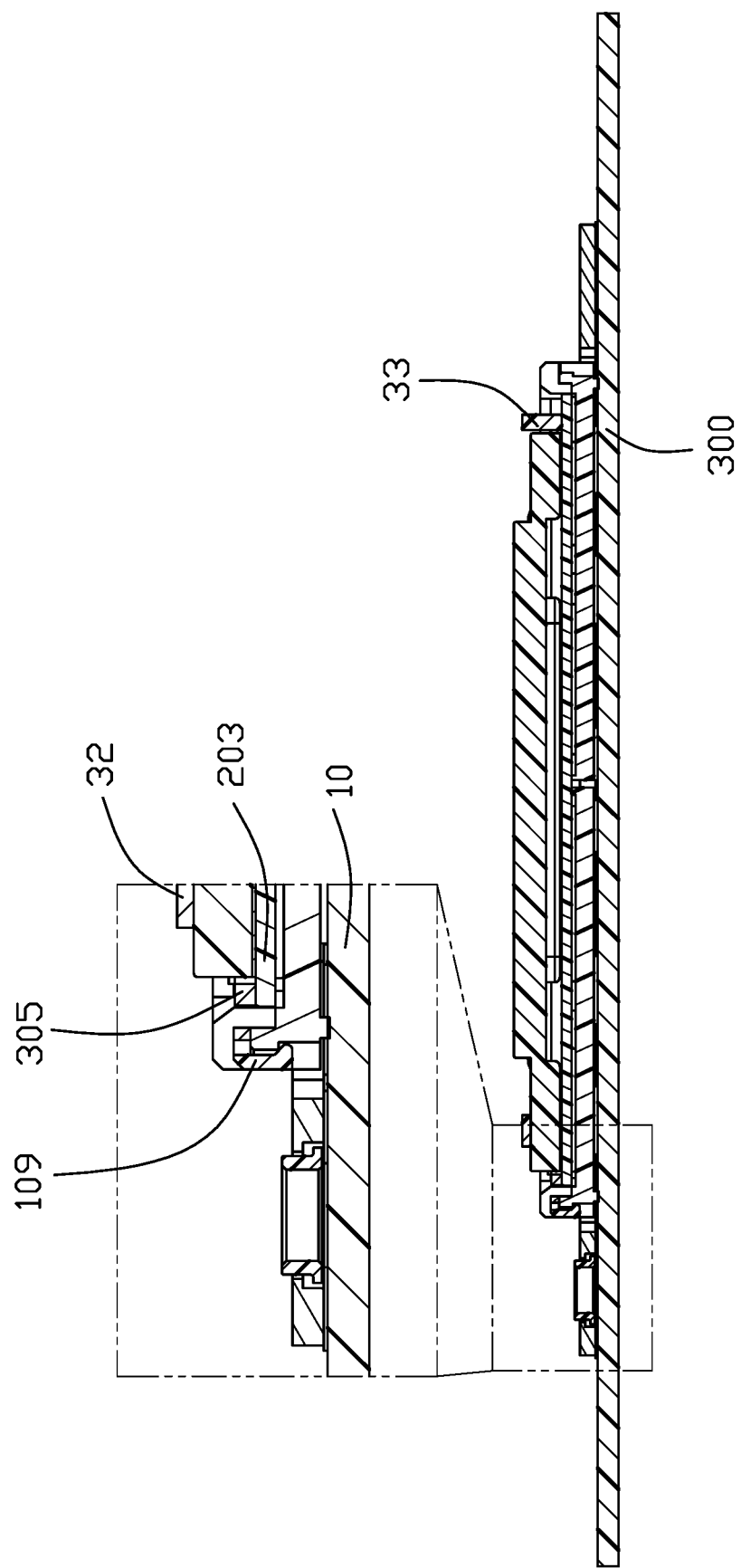
FIG. 10 is another cross-sectional view of the electrical connector assembly along line 10-10.
Figure 11:
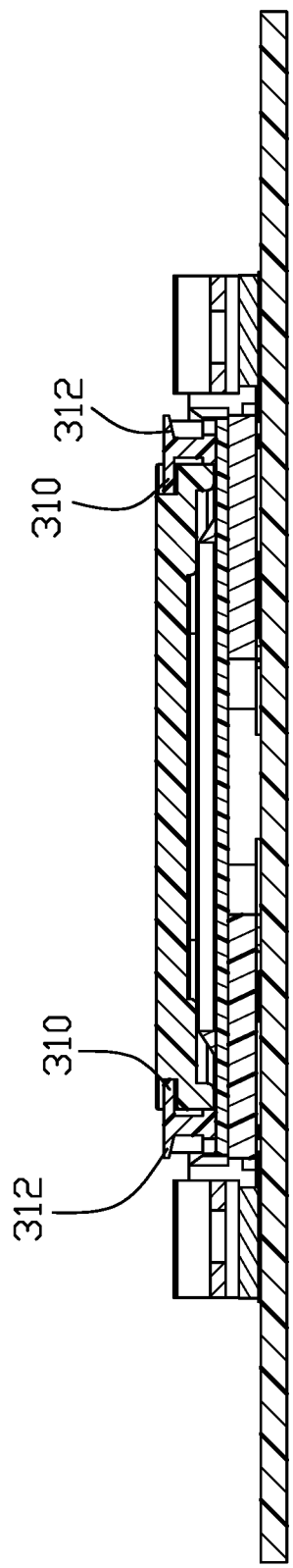
FIG. 11 is another cross-sectional view of the electrical connector assembly along line 11-11

Referring to FIGS. 1-10, an electrical connector 100 mounting upon a printed circuit board 300 to electrically connect an electronic package 200, i.e., the CPU (Central Processing Unit), with the printed circuit board 300 The connector 100 includes a connector unit 1, a metallic seat 2 surrounding the housing 1, and an insulative clip 3 for retaining the electronic package 200 therein. The connector unit 1 includes an insulative housing 10 defining a receiving space 101 to receive the electronic package 200, and a plurality of contacts (not shown) retained in the housing 10 for connecting the electronic package 200 to the printed circuit board 300. The clip 3 includes a frame 301 with two pairs of side walls to commonly form a receiving cavity 30 for receiving the electronic package 200 therein. Each side wall includes a pressing section. A pair of deflectable latches 34 are formed on lower sides of two corresponding opposite side walls to be engaged with a bottom surface 202 of the electronic package 200. The pressing section and the latches 34 cooperate with each other to retain the electronic package 200 in the receiving cavity 30.

The electronic package 200 includes an upper surface 201 with four recesses 2010 in four sides against which the pressing sections of the clip downwardly abut. In the clip 3, the frame 301 includes one pair of first/lateral side walls 31 with the second/front side wall 32 and the third/rear side wall 33 linked at two opposite ends wherein the latches 32 are formed on the second wide wall 32 and the third side wall 33, respectively. The pressing sections includes a pair of first pressing sections 310 of the pair of first side walls, a second pressing section 320 of the second side wall 32 and a third pressing section 330 of the third side wall 33. A pair of holding sections 312 are formed on the pair of first side walls 31 opposite to the pair of first pressing sections 310. Therefore, each first side wall 31 with the corresponding first pressing section 310 and the holding section 312 to commonly form a T-shaped cross-section thereof. Notably, the electronic package 200 experiences the downward forces from the pressing sections on four side respectively so as to be in an even manner. It is noted that a width dimension of the holding section 312 is limited for complying with the contour of the housing 10, thus avoiding interference with the heat sink which is adapted to be seated upon the electronic package 200 and secured to the seat 2. A pair of recesses 313 are formed under the corresponding holding sections 312 to provide space for holding and facilitate molding during manufacturing.

A releasing handle 321 is formed on the second side wall 32 so as to easily actuate the corresponding latch 34 to move outwardly for disengaging the electronic package 200 therefrom. Notably, the releasing handle 321 also functions as a foolproof device for assuring the clip 3 with the associated electronic package 200 retained therein can be correctly loaded into the connector unit in the right orientation. In details, an upper step 35 and a lower step 36 successively extend from the second side wall 32, and the releasing handle 321 extends from the lower step 36. In this embodiment, in operation the releasing handle 321 abuts against the printed circuit board 300 optimally.

The seat 2 forms an opening 20 to receive the releasing handle 321 therein. Notably, only under this orientation of the clip 3 allows the clip 3 with the associated electronic package 200 to be loaded into the connector unit 1. Understandably, the electronic package 200 is essentially square or rectangular with a base plate 203 in a bottom portion and a raised body (not labeled) thereon, thus tending to mislead the use during loading. In details, the alignment notches 209 are formed in a pair of opposite front and rear edges of the base plate 203 so as to respectively receive the corresponding alignment keys sets 109 which are detachably attached to the housing 10 of the connector unit 1. In this embodiment, a first triangle mark 41 is formed on a corner of the frame 301, and a second triangle mark 42 is formed on a corresponding corner of the electronic package 200 so as to decide the orientation of the electronic package 200 with regard to the clip 3 during assembling. In other words, via the assistance of identification via the first triangle mark 41 and the second triangle mark 42 for assuring the correct orientation of the electronic package 200 with regard to the clip 3, and the assistance of the releasing handle 321 received within the opening 20 of the seat 2 for assuring the correct orientation of the clip 3, with the associated electronic package 200, with regard to the connector unit 1, the electronic package 200 can be precisely loaded into the housing 10 of the connector unit 1 to connect to the printed circuit board 300 via the contacts (not shown) wherein the electronic package 200 is received in the receiving space 103 of the housing 10 in the correct orientation to allow the alignment notches 209 of the electronic package 200 receiving the corresponding alignment key sets 209, respectively.

The deflectable latch 34 extends from the upper step 35 downwardly, The second side wall 32 includes a pair of upstanding section s 322 so as to have the pressing section 320 and the pair of side pressing sections 323 raised upward for downwardly abutting against the recess 2010 of the electronic package 200. Notably, the height of the second side wall 32 is coplanar with the first pressing section 310.

In this embodiment, four side walls 31, 32 and 33 are equipped with the corresponding pressings sections 310, 320 and 330 to respectively downwardly press the corresponding four sides of the electronic package 200, thus assuring even and balanced forces applied upon the electronic package 200 during operation for superior electrical connection. On one hand, the latches 34 on the second side wall 32 can be protected by the corresponding lower step 36 and actuated to move outwardly for unlatching the electronic package 200 by the releasing handle 321. On the other hand, the latch 34 on the third side wall 33 can be protected by the corresponding step 36. The electronic package 200 can be properly loaded or unloaded with regard to the housing 10 of the connector unit 1 with assistance of the clip 3 without risks of damaging the fragile contacts (not shown). In this embodiment, in the electronic package 200, because the upward surface of the base plate 203 in the front region is very narrow, the clip 3 only forms a linking arm 305 on one lateral side of the upper step 35 of the second side wall 32 to support the releasing handle 321 while lacking on the other side for avoiding the potential interference with the alignment key set 109 which is attached upon the housing 10.

In brief, the features of the invention include the clip 3 with the releasing handle 321 not only closely located beside the corresponding latch 34 thereof for efficient operation/disengagement with the electronic package 200, which is retained in the clip 3 by the frame 301 circumferentially horizontally and by cooperation of the pressing sections 310, 320 and 330 with the latches 34, but also received within the opening 20 of the seat 2 for correct orientation so as to allow the corresponding electronic package 200 to be loaded into the housing 10 of the connector unit 1 in the correct orientation wherein a linking arm 305 of the clip 3 is formed on only one side of the latch 34 for reinforcing the structures thereabouts while lacking on the other side for avoiding interference with the alignment key set 109 of the housing 10 which is received within a corresponding alignment notch 209 in a base plate of the electronic package 200 for properly aligning the electronic package 200 within the housing 10. Understandably, once the latch 34 on the front side wall 32 is disengaged from the electronic package 200, the other latch 34 on the rear side wall 33 is also easily disengaged from the electronic package 200.

What is claimed is:

1. An electrical connector assembly for electrical connecting an electronic package to a printed circuit board, comprising: an electrical connector unit, a metallic seat surrounding the connector unit with an opening, both of said electronic connector unit and the seat mounted upon the printed circuit board, and a one piece insulative clip removably assembled within the connector unit; the connector unit including an insulative housing retaining a plurality of contacts, and defining a receiving space therein to receive said electronic package therein; the clip including: a frame with four side walls to snugly receive the electronic package therein circumferentially horizontally; four pressing sections formed on the four side walls including opposite front and rear side walls and a pair of laterals side walls, respectively, to downwardly press four sides of the electronic package in a vertical direction; and a pair of deflectable latches formed on the opposite front and rear side walls of the clip to upwardly abut against a downward bottom surface of the whole electronic package, respectively, so as to cooperate with the pressing sections located above the latches to retain the electronic package therebetween within the clip in the vertical direction; wherein a releasing handle extends forwardly from the front side wall to closely actuate the corresponding latch; wherein the front side wall includes an upper step from which the corresponding latch downwardly extends for engagement with a bottom surface of the electronic package; wherein said clip includes a linking arm extending transversely around the upper step along a transverse direction perpendicular to the vertical direction and only at one lateral side of the upper step.

2. The electrical connector assembly as claimed in claim 1, wherein the seat forms an opening around a front region to receive the releasing handle therein.

3. The electrical connector assembly as claimed in claim 1, wherein the releasing handle is seated upon the printed circuit board when assembled.

4. The electrical connector assembly as claimed in claim 1, wherein the front side wall further includes a lower step extending from the upper step and in front of the corresponding latch in a front-to-back direction perpendicular to the vertical direction to protect the corresponding latch.

5. The electrical connector assembly as claimed in claim 1, wherein the connector has an alignment key set located by the other lateral side of the upper step.

6. The electrical connector assembly as claimed in claim 1, wherein the electronic package includes a base plate, and the latch abuts upwardly against a bottom surface of said base plate, and the latch is located at a same level with the insulative housing.

7. The electrical connector assembly as claimed in claim 1, wherein the pair of lateral side walls of the clip form a pair of holding sections opposite to the corresponding pressing sections in a transverse direction perpendicular to the vertical direction, and a recess is formed under each holding section for finger reception.

8. An electrical connector assembly comprising:
a printed circuit board;
a connector including a connector unit and a metallic seat surrounding the connector unit with an opening in a front region and commonly mounted upon the printed circuit board, and a one piece clip to releasably hold an electronic package therein,
said connector unit including an insulative housing defining a receiving space to receive therein the clip and the associatively retained electronic package, and retaining a plurality of contacts thereto to mechanically and electrically connect to the electronic package; and
the clip including a frame formed with a pair of lateral side walls and opposite front side wall and rear side wall, and a pair of deflectable latches formed on the front side wall and the rear side wall respectively; wherein
said clip further includes a releasing handle extending from the front side wall to actuate the corresponding latch to move for disengaging the electronic package from the clip, and said releasing handle is located in the opening as a foolproof device during loading the electronic package into the housing of the connector unit; wherein
the releasing handle is supportably seated upon the printed circuit board.

9. The electrical connector assembly as claimed in claim 8, wherein the clip further includes at least a pair of opposite pressing sections respectively formed on either the pair of lateral side walls or the opposite front and rear side walls to downwardly press corresponding two opposite sides of the electronic package.

10. The electronic connector assembly as claimed in claim 9, wherein the electronic package forms a pair of recesses in an upper face to receive the corresponding pressing sections therein, respectively.

11. The electrical connector assembly as claimed in claim 9, wherein said pair of pressing sections are respectively formed on the front side wall and the rear side wall, and the pressing section formed on the front side wall extends with a full width of the clip in a transverse direction.

12. The electrical connector assembly as claimed in claim 8, wherein the housing of the connector unit further includes an alignment key set to be received within a corresponding alignment notch in a base plate of the electronic package, and said alignment key set is located adjacent to the opening.

13. The electrical connector assembly as claimed in claim 12, wherein the clip includes a linking arm transversely connected to the front side wall on one lateral side of the corresponding latch so as to reinforce structures thereabouts, while no linking arm is formed on the other lateral side of the corresponding latch for avoiding interference with the alignment key set.

14. An electrical assembly comprising: an electronic package having a base plate and a raised body thereon, a pair of alignment notches respectively formed in opposite front and rear edges of the base plate; and an insulative clip including a frame with opposite lateral side walls and opposite front and rear side walls to commonly form a receiving cavity to receive the electronic package therein, at least a pair of pressing sections formed on either said opposite lateral side walls or said opposite front and rear side walls to downwardly press the raised body, and a pair of deflectable latches formed on opposite front and rear side walls to upwardly abut against a bottom surface of the base plate; wherein a releasing handle extends from the front side wall to actuate the corresponding latch to move for disengaging the electronic package from the clip; wherein the deflectable latches are protectively hidden under a step structure of the front side wall and unexposed upwardly to an exterior when the electronic package is disengaged from the clip; wherein said step structure includes an upper step extending forwardly from the front side wall, and a front edge of the electronic Package forwardly abuts against said upper step in a front-to-back direction and the corresponding latch essentially extends from the upper step; wherein said clip further includes a transversely extending linking arm connected to one lateral side of the upper step in a transverse direction while no transversely extending linking arm connected to the other lateral side of the upper step.

15. The electrical assembly as claimed in claim 14, wherein said step structure further includes a lower step further extending forwardly from the upper step to protect the corresponding latch and the releasing handle forwardly extends from the lower step.

16. The electrical assembly as claimed in claim 14, wherein the alignment notch in the front edge of the electronic package is located by the other lateral side of the upper step.

* * * * *